United States Patent
Mustafa et al.

(10) Patent No.: US 11,420,217 B2
(45) Date of Patent: *Aug. 23, 2022

(54) SHOWERHEAD FOR ALD PRECURSOR DELIVERY

(71) Applicant: APPLIED MATERIALS, INC., Santa Clara, CA (US)

(72) Inventors: Muhannad Mustafa, Santa Clara, CA (US); Muhammad M. Rasheed, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 138 days.

This patent is subject to a terminal disclaimer.

(21) Appl. No.: 16/721,724

(22) Filed: Dec. 19, 2019

(65) Prior Publication Data

US 2021/0187521 A1 Jun. 24, 2021

(51) Int. Cl.
| | | |
|---|---|---|
| C23C 16/40 | (2006.01) | |
| B05B 1/18 | (2006.01) | |
| B05B 1/00 | (2006.01) | |
| C23C 16/455 | (2006.01) | |

(Continued)

(52) U.S. Cl.
CPC ........... B05B 1/185 (2013.01); B05B 1/005 (2013.01); C23C 16/45544 (2013.01); C23C 16/45553 (2013.01); C23C 16/45565 (2013.01); C23C 16/45574 (2013.01); C23C 16/458 (2013.01); C23C 16/4586 (2013.01); H01L 21/687 (2013.01)

(58) Field of Classification Search
CPC ... B05B 1/185; B05B 1/005; C23C 16/45553; C23C 16/45574; C23C 16/45544; C23C 16/45565; C23C 16/458; C23C 16/4586; H01L 21/687

USPC .............. 118/715; 156/345.33, 345.34
See application file for complete search history.

(56) References Cited

U.S. PATENT DOCUMENTS

| | | | |
|---|---|---|---|
| 5,500,256 A * | 3/1996 | Watabe | C23C 16/45561 |
| | | | 427/579 |
| 8,955,547 B2 * | 2/2015 | Gungor | F17C 1/00 |
| | | | 137/597 |
| 9,914,999 B2 | 3/2018 | Rasheed et al. | |

(Continued)

OTHER PUBLICATIONS

PCT International Search Report and Written Opinion for PCT/US2020/065770 dated Apr. 16, 2021.

*Primary Examiner* — Rudy Zervigon
(74) *Attorney, Agent, or Firm* — Moser Taboada (57) ABSTRACT

Embodiments of showerheads for use in a process chamber are provided herein. In some embodiments, a showerhead includes a first spiral channel extending from a central region to a peripheral region of the showerhead; a second spiral channel extending from a central region to a peripheral region of the showerhead, wherein the second spiral channel is interleaved with the first spiral channel and fluidly independent from the first spiral channel; a plurality of first channels extending from the first spiral channel to a plurality of first gas distribution holes on a lower surface of the showerhead, wherein each first channel is a singular channel extending at an angle; and a plurality of second channels extending from the second spiral channel to a plurality of second gas distribution holes on the lower surface of the showerhead, wherein each second channel is a singular channel extending at an angle.

20 Claims, 4 Drawing Sheets

(51) Int. Cl.
 *C23C 16/458* (2006.01)
 *H01L 21/687* (2006.01)

(56) References Cited

U.S. PATENT DOCUMENTS

| | | | |
|---|---|---|---|
| 10,167,553 B2* | 1/2019 | Rasheed | C23C 16/455 |
| 10,519,546 B2* | 12/2019 | Jallepally | C23C 16/455 |
| 11,186,910 B2* | 11/2021 | Mustafa | C23C 16/45565 |
| 2009/0095222 A1 | 4/2009 | Tam et al. | |
| 2010/0024727 A1 | 2/2010 | Kim et al. | |
| 2013/0098477 A1 | 4/2013 | Yudovsky et al. | |
| 2013/0263944 A1* | 10/2013 | Gungor | F17C 1/00 137/507 |
| 2015/0176126 A1* | 6/2015 | Ge | C23C 16/45574 137/240 |
| 2017/0283947 A1* | 10/2017 | Rasheed | C23C 16/509 |
| 2017/0306491 A1 | 10/2017 | Liang et al. | |
| 2018/0142352 A1 | 5/2018 | Shah et al. | |
| 2019/0078205 A1* | 3/2019 | Jallepally | C23C 16/45565 |

* cited by examiner

SHOWERHEAD FOR ALD PRECURSOR DELIVERY

FIELD

Embodiments of the present disclosure generally relate to a substrate processing equipment.

BACKGROUND

Deposition chambers are typically used to deposit material layers over featured formed on substrates. Atomic layer deposition (ALD) and chemical vapor deposition (CVD) are deposition techniques used for the deposition of material layers. One example of an ALD process includes the sequential introduction of pulses of gases through a gas distribution apparatus, such as a showerhead. For instance, one cycle for the sequential introduction of pulses of gases may contain a pulse of a first reactant gas, followed by a pulse of a purge gas and/or a pump evacuation, followed by a pulse of a second reactant gas, and followed by a pulse of a purge gas and/or a pump evacuation. Sequential introduction of separate pulses of the first reactant and the second reactant may result in the alternating self-limiting absorption of monolayers of the reactants on the surface of the substrate and, thus, forms a monolayer of material for each cycle. The cycle may be repeated until a desired thickness of the deposited material is reached. A pulse of a purge gas and/or a pump evacuation between the pulses of the first reactant gas and the pulses of the second reactant gas serves to reduce the likelihood of gas phase reactions of the reactants due to excess amounts of the reactants remaining in the chamber. However, the inventors have observed that gas distribution apparatus are difficult to clean or purge and that during some deposition processes, introduction of pulses of gases through the gas distribution apparatus leads to deposition non-uniformity across the substrate.

Therefore, the inventors have provided improved gas distribution apparatus for use in deposition chambers.

SUMMARY

Embodiments of showerheads for use in a process chamber are provided herein. In some embodiments, a showerhead for use in a process chamber includes a first spiral channel extending from a central region of the showerhead to a peripheral region of the showerhead; a second spiral channel extending from a central region of the showerhead to a peripheral region of the showerhead, wherein the second spiral channel is interleaved with the first spiral channel and fluidly independent from the first spiral channel; a plurality of first channels extending from the first spiral channel to a plurality of first gas distribution holes on a lower surface of the showerhead, wherein each first channel is a singular channel extending at an angle with respect to an axis normal to the lower surface of the showerhead; and a plurality of second channels extending from the second spiral channel to a plurality of second gas distribution holes on the lower surface of the showerhead, wherein each second channel is a singular channel extending at an angle with respect to an axis normal to the lower surface of the showerhead.

In some embodiments, a showerhead for use in a process chamber includes a lower surface of the showerhead having a plurality of first gas distribution holes a plurality of second gas distribution holes; an upper surface of the showerhead having a recess that defines a first surface; a first spiral channel extending from a central region of the first surface to a peripheral region of the first surface in a spiral pattern; a plurality of first channels extending from the first spiral channel to the plurality of first gas distribution holes; a second spiral channel extending from a central region of the first surface to a peripheral region of the first surface in a spiral pattern, wherein the second spiral channel is fluidly independent of the first spiral channel; and a plurality of second channels extending from the second spiral channel to the plurality of second gas distributions holes, wherein the plurality of first gas distribution holes and the plurality of second gas distributions holes extend at an angle of about 2 degrees to about 9 degrees with respect to an axis normal to the lower surface of the showerhead.

In some embodiments, a process chamber includes a chamber body having an processing volume; a substrate support disposed in the processing volume and having a substrate support surface to support a substrate having an outer edge; a showerhead disposed in the processing volume opposite of the substrate support, wherein the showerhead comprises: a first spiral channel and a second spiral channel extending from a central region of the showerhead to a peripheral region of the showerhead, wherein the first spiral channel is interleaved with and fluidly independent from the second spiral channel; a plurality of first channels extending from the first spiral channel to a plurality of first gas distribution holes on a lower surface of the showerhead; a plurality of second channels extending from the second spiral channel to a plurality of second gas distribution holes on the lower surface of the showerhead, wherein the plurality of first gas distribution holes and the plurality of second gas distributions holes extend at an angle with respect to an axis normal to the lower surface of the showerhead; and a first exhaust port coupled to the first spiral channel at an end opposite the first inlet and a second exhaust port coupled to the second spiral channel at an end opposite the second inlet, wherein the first exhaust port and the second exhaust port are disposed about 0.25 inches to about 1.50 inches radially outward of the outer edge of the substrate.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of gas distribution apparatus, such as showerheads are provided herein. The showerheads provided herein advantageously provide isolated flow paths for multiple process gases to reduce or prevent reaction between the process gases within the showerhead. Examples of suitable processing chambers for incorporation of the teachings described herein include high dielectric constant (i.e., high k) and metal ALD deposition chambers available from Applied Materials, Inc., of Santa Clara, Calif., although other chambers available from Applied Materials, Inc. or other manufacturers may also benefit. The following process chamber description is provided for context and exemplary purposes and should not be construed as limiting the scope of the disclosure.

Figure 1:
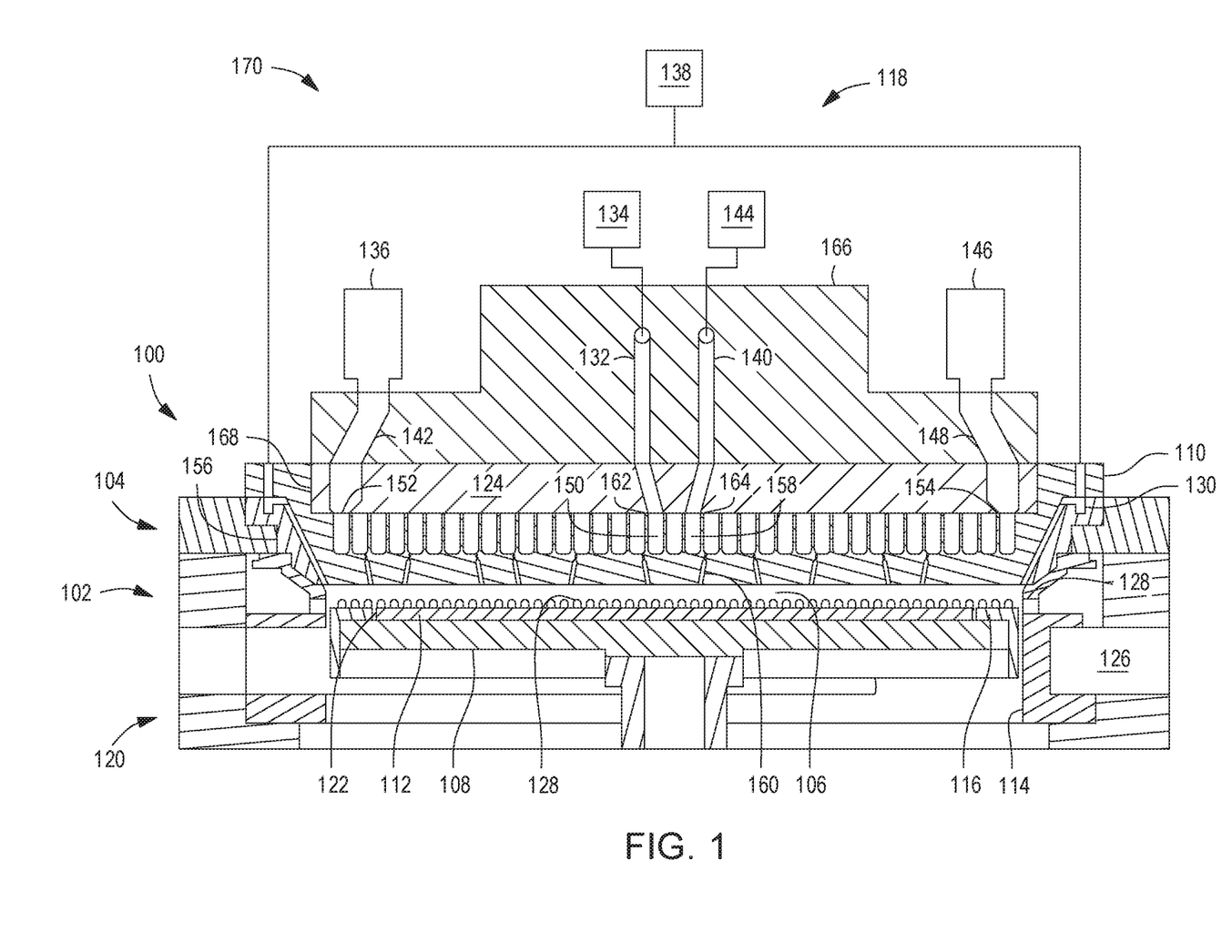
FIG. 1 depicts a schematic side cross-sectional view of a process chamber in accordance with some embodiments of the present disclosure.

FIG. 1 depicts a schematic side cross-sectional view of a process chamber (process chamber 100) in accordance with some embodiments of the present disclosure. The process chamber 100 includes a chamber body 102 and a lid assembly 104 having a processing volume 106 defined within the chamber body 102 and beneath the lid assembly 104. A slit valve 120 in the chamber body 102 provides access for a robot (not shown) to deliver and/or retrieve a substrate 112 having an outer edge 122 to and from the process chamber 100. The substrate 112 may be a 150 mm, 200 mm, 300 mm, 450 mm, or the like semiconductor wafer, a glass substrate, or the like.

A substrate support 108 supports a substrate on a substrate receiving surface in the process chamber 100. The substrate support 108 is mounted to a lift motor for raising and lowering the substrate support 108 and the substrate when disposed on the substrate support 108. The substrate support 108 may include a vacuum chuck (not shown), an electrostatic chuck (not shown), or a clamp ring (not shown) for securing the substrate to the substrate support 108 during processing.

The temperature of the substrate support 108 may be adjusted to control the temperature of the substrate. For example, substrate support 108 may be heated using an embedded heating element, such as a resistive heater, or may be heated using radiant heat, such as heating lamps configured to provide heat energy to the substrate support 108.

In some embodiments, an edge ring 116 may be disposed atop a peripheral edge of the substrate support 108. The edge ring 116 includes a central opening sized to expose the support surface of the substrate support 108. The edge ring 116 may further include a skirt, or downwardly extending annular lip to protect the sides of the substrate support 108.

In some embodiments, a liner 114 is disposed along the interior walls (e.g., one or more sidewalls) of the chamber body 102 to protect the chamber body 102 from corrosive gases or deposition of materials during operation. The liner 114 includes a plurality of openings 128 to fluidly couple the processing volume 106 to a pump port 126 to facilitate evacuation of gases from the process chamber 100 and maintaining a predetermined pressure or pressure range inside the process chamber 100 via a vacuum pump coupled to the pump port 126.

A gas delivery system 118 is coupled to the lid assembly 104 to provide gases, such as process gases and/or a purge gas, to the processing volume 106 through a showerhead 110. The showerhead 110 is disposed in the lid assembly 104 generally opposite the substrate support 108 and includes a plurality of gas distribution holes 160 to provide process gases to the processing volume 106. The showerhead 110 includes a plurality of interleaved spiral channels that are fluidly independent from each other to supply a plurality of process gases to the processing volume 106 without mixing in the showerhead 110. The plurality of interleaved spiral channels are fluidly coupled to respective holes of the plurality of gas distribution holes 160. In some embodiments, the plurality of interleaved spiral channels includes a first spiral channel 150 and a second spiral channel 158. In some embodiments, the plurality of interleaved spiral channels includes three or more interleaved spiral channels.

In some embodiments, the gas delivery system 118 includes a backing plate 124 to enclose the first spiral channel 150 and the second spiral channel 158. In some embodiments, the backing plate 124 is disposed in a recess 168 formed on a back surface of the showerhead 110. In some embodiments, an upper surface of the backing plate 124 is substantially coplanar with an upper surface of the showerhead 110.

In embodiments with two interleaved spiral channels, the gas delivery system 118 includes a first supply line 132 to provide a first process gas from a first gas source 134 to the showerhead 110 and a second supply line 140 to provide a second process gas from a second gas source 144 to the showerhead 110. In some embodiments, the gas delivery system 118 includes a gas manifold 166. In some embodiments, the first supply line 132 extends from the first gas source 134 to the showerhead 110 via the gas manifold 166 and the backing plate 124. In some embodiments, the second supply line 140 extends from the second gas source 144 to the showerhead 110 via the gas manifold 166 and the backing plate 124. A first inlet 162 is coupled to the first spiral channel 150 to provide the first process gas from the first supply line 132 to the processing volume 106. A second inlet 164 is fluidly coupled to the second spiral channel 158 to provide the second process gas from the second gas source 144 to the processing volume 106.

The showerhead includes a first exhaust port 152 is coupled to the first spiral channel 150 and a second exhaust port 154 coupled to the second spiral channel 158. The first exhaust port 152 is coupled to a first exhaust pump 136 via a first exhaust line 142. The first exhaust pump 136 is configured to evacuate the first spiral channel 150. The second exhaust port 154 is coupled to a second exhaust pump 146 via a second exhaust line 148. The second exhaust pump 146 is configured to evacuate the second spiral channel 158. In some embodiments, the first exhaust line 142 and the second exhaust line 148 extend through the gas manifold 166. The inventors have observed non-uniform deposition on the substrate 112 when the first exhaust port 152 and the second exhaust port 154 are disposed over the substrate 112. In some embodiments, the first exhaust port 152 and the second exhaust port 154 are disposed radially outward of the outer edge 122 of the substrate 112 to advantageously reduce deposition non-uniformity on the substrate 112 when the showerhead 110 is pumped down. In some embodiments, the first exhaust port 152 and the second exhaust port 154 are disposed about 0.25 inches to about 1.50 inches radially outward of the outer edge of the substrate 112.

In some embodiments, the gas delivery system 118 includes a purge gas source 138 to provide a purge gas to the processing volume 106 via one or more purge gas supply lines 170 (two shown in FIG. 1). In some embodiments, the one or more purge gas supply lines 170 are fluidly coupled to respective one or more purge gas inlets (shown in FIG. 2) of the showerhead 110. The purge gas is configured to flow through from the purge gas inlets to the processing volume 106 via a gap between the showerhead 110 and the liner 114. In some embodiments, an isolator 156 is disposed between the showerhead 110 and the liner 114 to reduce or prevent electrical arcing therebetween. In some embodiments, a profile of an inner surface of the isolator 156 corresponds with a profile of an outer surface of the showerhead 110. In some embodiments, the purge gas is configured to flow between the showerhead 110 and the isolator 156. In some embodiments, the isolator 156 includes an annular channel 130 at an upper surface of the isolator 156. The annular channel 130 is fluidly coupled to the purge gas inlets of the showerhead 110 and configured to direct the flow of purge gas between the isolator 156 and the showerhead 110.

In an illustrative processing operation, a substrate 112 is delivered to the process chamber 100 through the slit valve 120 by a robot (not shown). The substrate 112 is positioned on the substrate support 108 through cooperation of lift pins and the robot. The substrate support 108 raises the substrate 112 into close opposition to a lower surface of the showerhead 110. A first gas flow (e.g., from the first gas source 134) may be injected into the processing volume 106 by the gas delivery system 118 together or sequentially (e.g., in pulses) with a second gas flow (e.g., from the second gas source 144). The first gas source 134 includes a first precursor and the second gas source 144 includes a second precursor. A third gas flow (e.g., from the purge gas source 138) may be injected into the processing volume 106 together with the first gas flow and the second gas flow or sequentially (e.g., in pulses) before or after each of the first gas flow and the second gas flow are injected. The purge gas source includes any gas suitable for in-situ treatment. The gas is then deposited on the surface of substrate. Excess gas, by-products, and the like flow through the plurality of openings 128 in the liner 114 to the pump port 126 and are then exhausted from process chamber 100.

Figure 2:
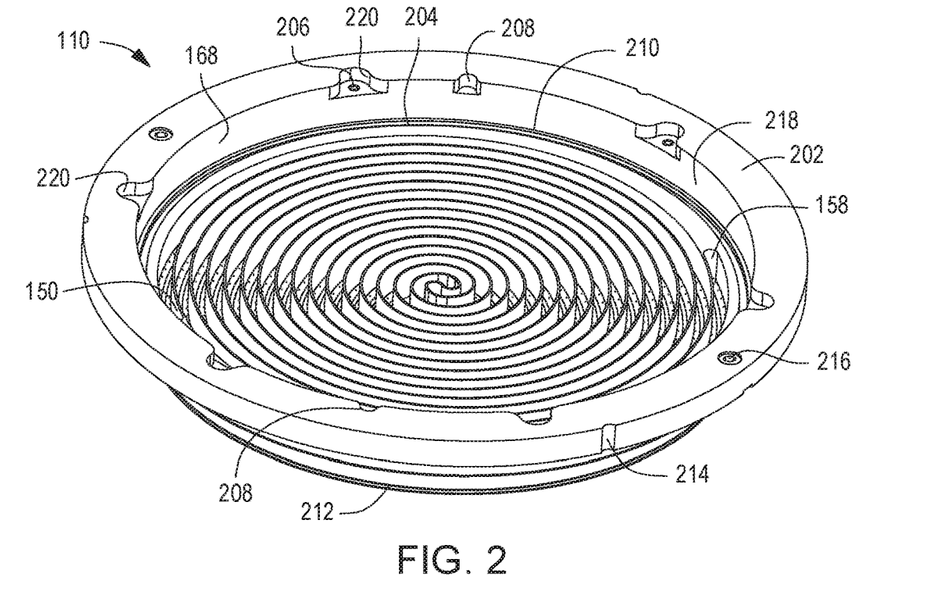
FIG. 2 depicts a top isometric view of a showerhead in accordance with some embodiments of the present disclosure.

FIG. 2 depicts a top isometric view of a showerhead in accordance with some embodiments of the present disclosure. The first spiral channel 150 and a second spiral channel 158 extend from a central region of the showerhead 110 to a peripheral region of the showerhead 110. In some embodiments, the upper surface 202 of the showerhead 110 includes the recess 168. The recess 168 defines a first surface 204 and a second surface 218. In some embodiments, the first surface 204 includes a sealing groove 210 that extends annularly about the first spiral channel 150 and the second spiral channel 158. An o-ring may be disposed in the sealing groove 210 to seal the first spiral channel 150 and the second spiral channel 158. In some embodiments, the first surface 204 is substantially parallel to the upper surface 202.

In some embodiments, an upper surface 202 of the showerhead 110 includes a plurality of openings 206 configured to receive mounting screws. In some embodiments, the plurality of openings 206 facilitate coupling the showerhead 110 to the backing plate 124. In some embodiments, the plurality of openings 206 are disposed in features 220 recessed from the upper surface 202. In some embodiments, the features 220 extend radially outward from the second surface 218 of the recess 168. In some embodiments, the features 220 are disposed axisymmetrically about the showerhead 110. In some embodiments, the upper surface 202 of the showerhead includes a plurality of alignment features 208 to align the showerhead 110 with the backing plate 124. In some embodiments, the alignment features 208 are disposed between features 220.

In some embodiments, the outer surface 212 of the showerhead 110 includes one or more grooves 214 configured to align the showerhead 110 with the lid assembly 104. In some embodiments, the one or more grooves 214 are three grooves that are disposed axisymmetrically about the showerhead 110. In some embodiments, the upper surface 202 includes one or more purge gas inlets 216 configured to flow a purge gas (e.g., from purge gas source 138) through the showerhead 110. In some embodiments, the one or more purge gas inlets 216 includes two inlets diametrically opposed.

Figure 3:
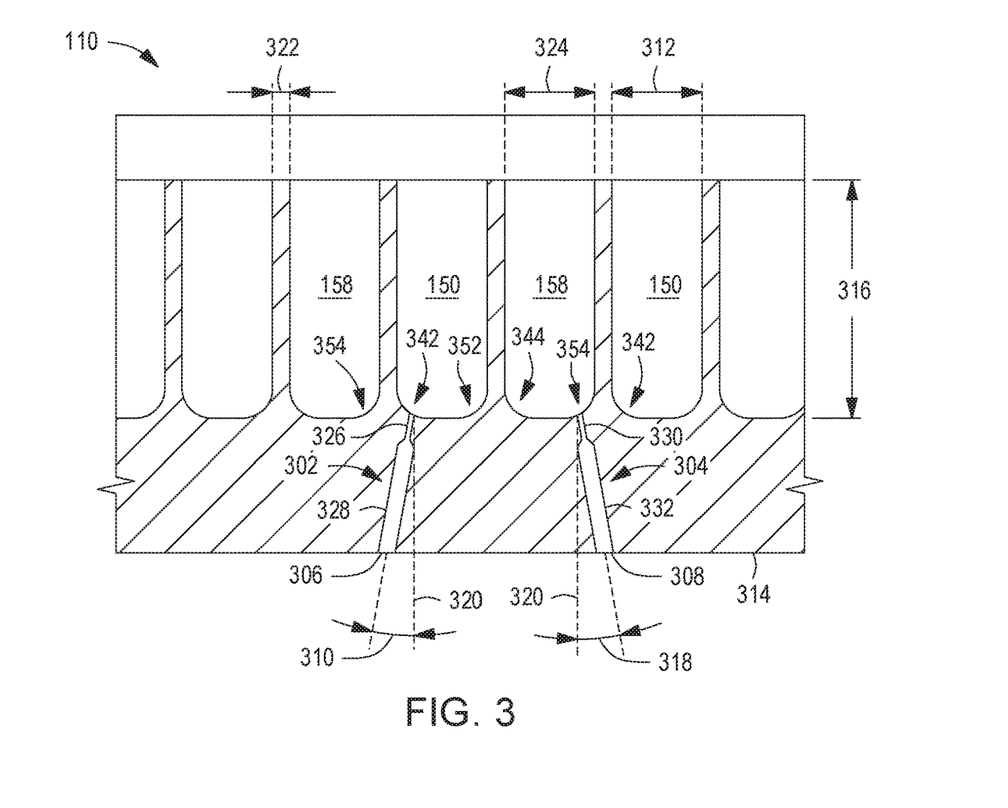
FIG. 3 is a cross-sectional side view of a portion of a showerhead in accordance with some embodiments of the present disclosure.

FIG. 3 is a cross-sectional side view of a portion of a showerhead in accordance with some embodiments of the present disclosure. The plurality of gas distribution holes 160 comprise a plurality of first channels 302 and a plurality of second channels 304. The plurality of first channels 302 extend from the first spiral channel 150 to a plurality of first gas distribution holes 306 on a lower surface 314 of the showerhead 110. The plurality of second channels 304 extend from the second spiral channel 158 to a plurality of second gas distribution holes 308 on the lower surface 314 of the showerhead.

The first spiral channel 150 and the second spiral channel 158 have an overall length corresponding to a distance between the respective first and second inlets 162, 164 and the first and second exhaust ports 152, 154. The first gas distribution holes 306 are spaced along the overall length of the first spiral channel 150. The second gas distribution holes 308 are spaced along the overall length of the second spiral channel 158. In some embodiments, the overall length of the first spiral channel 150 and the second spiral channel 158 is about 120 inches to about 168 inches. In some embodiments, the first spiral channel 150 includes about 800 to about 900 first gas distribution holes 306. In some embodiments, the second spiral channel 158 includes about 800 to about 900 second gas distribution holes 308.

The first spiral channel 150 and the second spiral channel 158 may have a volume suitable for the process being performed by the process chamber 100. A smaller volume allows for faster saturation and evacuation of the first spiral channel 150 and the second spiral channel 158 and provides a lower amount of process gas to the processing volume 106. A smaller volume is more suitable for processes with shorter pulse times for thin film deposition. A larger volume allows for slower saturation and evacuation of the first spiral channel 150 and the second spiral channel 158 and provides a greater amount of process gas to the processing volume 106. As such, the volumes of the first spiral channel 150 and the second spiral channel 158 can correspond with desired film thickness and pulse times.

In some embodiments, the first spiral channel 150 and the second spiral channel 158 have different volumes. In some embodiments, the first spiral channel 150 and the second spiral channel 158 have similar volumes, including equal volumes. In some embodiments, a width 312 of the first spiral channel 150 is substantially the same as a width 324 of the second spiral channel 158. In some embodiments the width 324 and the width 312 are about 0.1 inches to about 0.4 inches. In some embodiments, a depth 316 of the first spiral channel 150 and the second spiral channel 158 is about 0.1 inches to about 1.20 inches. In some embodiments, a wall thickness 322 between the first spiral channel 150 and the second spiral channel 158 is about 0.02 inches to about 0.08 inches.

Figure 4:
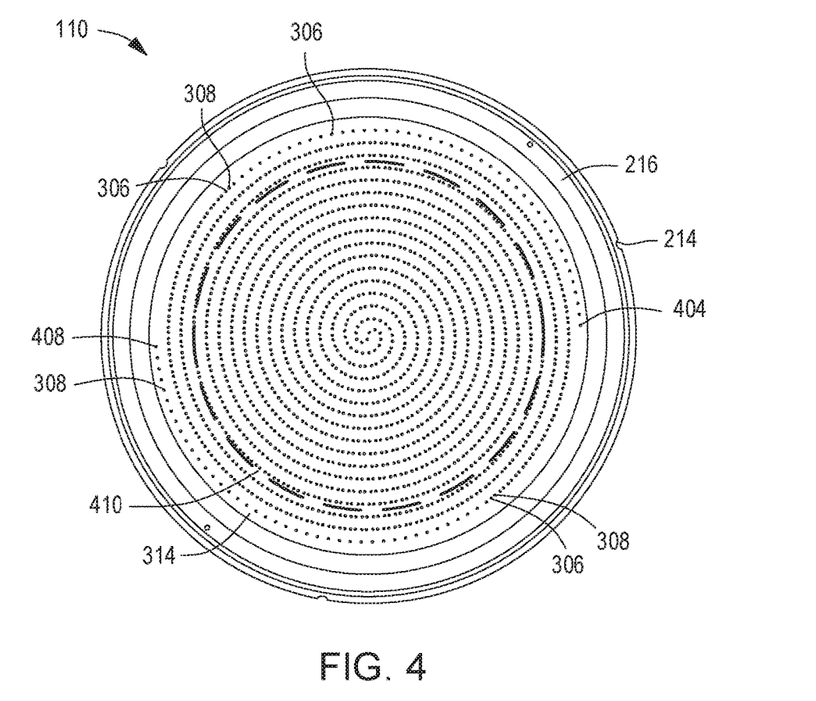
FIG. 4 depicts a bottom view of a showerhead in accordance with some embodiments of the present disclosure.

The plurality of first channels 302 and the plurality of second channels 304 are advantageously angled so that the plurality of first gas distribution holes 306 and the plurality of second gas distribution holes 308 converge in an alternating fashion along a spiral pattern at a lower surface 314 of the showerhead 110 (as shown, for example, in FIG. 4). In some embodiments, the spiral pattern comprises two interleaved spiral patterns extending from the central region of the showerhead 110 to the peripheral region of the showerhead 110 (see FIG. 4). By alternating and converging along the spiral pattern, the first gas distribution holes 306 and the second gas distribution holes 308 can advantageously provide the first process gas and the second process gas, respectively, in a more uniform manner to the substrate 112.

The plurality of first channels 302 extend at a first angle 310 with respect to an axis 320 normal to the lower surface 314 of the showerhead 110. The plurality of first channels 302 extend outward from the first spiral channel 150 (e.g., outward with respect to the first spiral channel 150 itself) to the lower surface 314. In some embodiments, the plurality of first channels 302 extend outward from a first side 342 of the first spiral channel 150. In some embodiments, the plurality of first channels 302 extend outward from a second side 352 of the plurality of first channels 302. In some embodiments, some of the plurality of first channels 302 extend outward from the first spiral channel 150 from the first side 342 and others of the plurality of first channels 302 extend outward from the first spiral channel 150 from the second side 352. For example, the plurality of first channels 302 can alternate between extending outward from the first side 342 and outward from the second side 352 (as also depicted in the partial top view of FIG. 6).

The plurality of second channels 304 extend at a second angle 318 with respect to an axis 320 normal to the lower surface 314 of the showerhead 110. The plurality of second channels 304 extend outward from the second spiral channel 158 (e.g., outward with respect to the second spiral channel 158 itself) to the lower surface 314. In some embodiments, the plurality of second channels 304 extend outward from a first side 344 of the second spiral channel 158. In some embodiments, the plurality of second channels 304 extend outward from a second side 354 of the second spiral channel 158. In some embodiments, some of the plurality of second channels 304 extend outward from the second spiral channel 158 from the first side 344 and others of the plurality of second channels 304 extend outward from the second spiral channel 158 from the second side 354. For example, the plurality of second channels 304 can alternate between extending outward from the first side 344 and outward from the second side 354 (as also depicted in the partial top view of FIG. 6).

In some embodiments, the first angle 310 is about 2 degrees to about 40 degrees. In some embodiments, the second angle 318 is about 2 degrees to about 40 degrees. In some embodiments, the first angle 310 is about 2 degrees to about 9 degrees. In some embodiments, the second angle 318 is about 2 degrees to about 9 degrees. The first angle 310 may be determined based on the width 312 and depth 316 of the first spiral channel 150. The second angle 318 may be determined based on the widths 324 and depth 316 of the second spiral channel 158. In some embodiments, the first angle 310 and the second angle 318 are substantially the same. In some embodiments, the first angle 310 and the second angle 318 are within about 5 degrees from each other.

In some embodiments, the plurality of first channels 302 extend from the first side 342 of the first spiral channel 150 and the plurality of second channels 304 extend from the second side 354 of the second spiral channel 158 (i.e., angled toward each other) so that the plurality of first gas distribution holes 306 and the plurality of second gas distribution holes 308 converge in an alternating fashion along a spiral pattern at the lower surface 314 of the showerhead 110. In some embodiments, the plurality of first channels 302 extend from the second side 354 of the first spiral channel 150 and the plurality of second channels 304 extend from the first side 344 of the second spiral channel 158 so that the plurality of first gas distribution holes 306 and the plurality of second gas distribution holes 308 converge in an alternating fashion along a spiral pattern at the lower surface 314 of the showerhead 110. See, for example, FIG. 4 and corresponding discussion, below.

Figure 6:
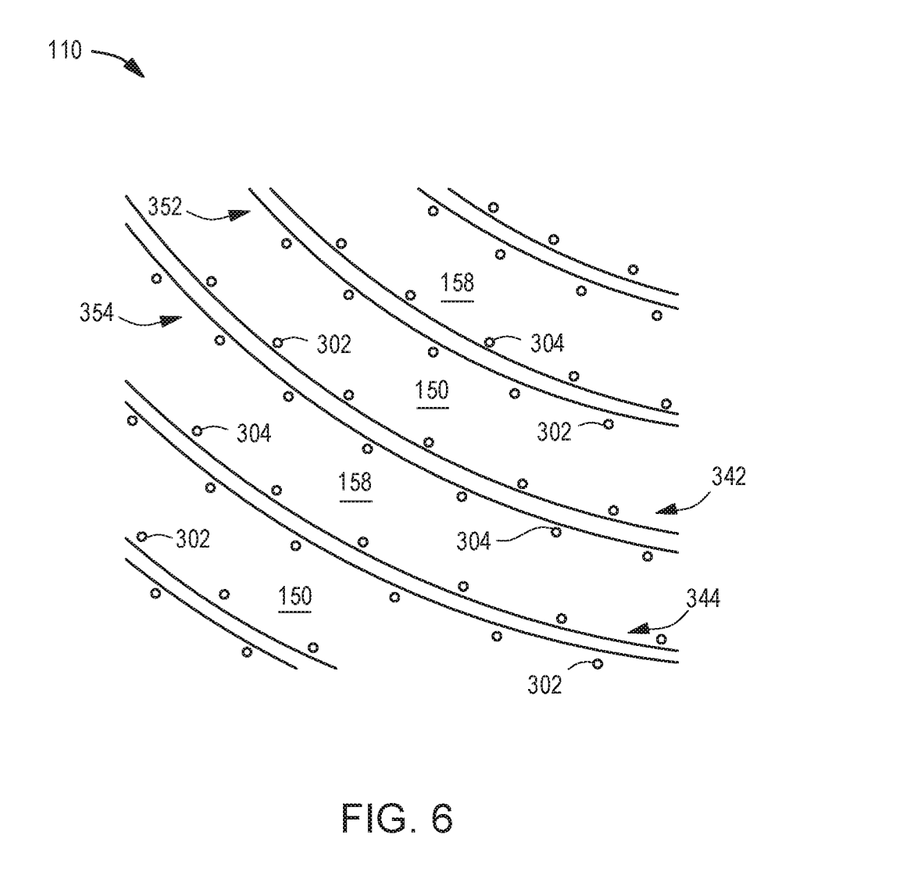
FIG. 6 depicts a top view of a portion of a showerhead in accordance with some embodiments of the present disclosure.

FIG. 6 depicts a partial top view of a showerhead in accordance with some embodiments of the present disclosure. In some embodiments, as shown in FIG. 6, some of the plurality of first channels 302 extend from the first side 342 of the first spiral channel 150 and some of the plurality of second channels 304 extend from the second side 354 of the second spiral channel 158, and others of the plurality of first channels 302 extend from the second side 352 of the first spiral channel 150 and others of the plurality of second channels 304 extend from the first side 344 of the second spiral channel 158 so that the plurality of first gas distribution holes 306 and the plurality of second gas distribution holes 308 converge in an alternating fashion along a spiral pattern at the lower surface 314 of the showerhead 110.

In some embodiments, each first channel of the plurality of first channels 302 is a singular channel at any given cross-section having a first channel 302 taken along the overall length of the first spiral channel 150. In some embodiments, each second channel of the plurality of second channels 304 is a singular channel at any given cross-section taken along the overall length of the second spiral channel 158.

In some embodiments, each of the plurality of first channels 302 includes an upper portion 326 and a lower portion 328. In some embodiments, each of the plurality of second channels 304 include an upper portion 330 and a lower portion 332. In some embodiments, the upper portions 326, 330 have a diameter that is less than a diameter of the lower portions 328, 332 to choke a flow through the first and second channels 302, 304. In some embodiments, the upper portions 326, 330 have a diameter of about 0.01 inches to about 0.02 inches. In some embodiments, the lower portions 328, 332 have a diameter of about 0.04 inches to about 0.08 inches. In some embodiments, the upper portions 326, 330 have a length that is shorter than a length of the lower portions 328, 332 for increased flow conductance. In some embodiments, the upper portions 326, 330 have a length that is similar to, including equal to, a length of the lower portions 328, 332.

FIG. 4 depicts a bottom view of a showerhead in accordance with some embodiments of the present disclosure. In some embodiments, the plurality of first gas distribution holes and the plurality of second gas distribution holes are arranged in an alternating pattern to define a spiral pattern. In some embodiments, the plurality of first gas distribution holes and the plurality of second gas distribution holes are arranged in an alternating pattern to define an interleaved spiral pattern including a first spiral pattern and a second spiral pattern, interleaved with the first spiral pattern.

A substrate region 410 of the bottom surface of the showerhead 110 corresponds with a size and location of a substrate being processed (e.g., substrate 112). The substrate region 410 has a diameter substantially equal to or greater than a given diameter of a substrate being processed. For example, if the process chamber is configured to process 300 mm wafers, the substrate region 410 has a diameter substantially equal to or greater than 300 mm.

Because of the spiral profiles, the plurality of first gas distribution holes 306 and the plurality of second gas distribution holes 308 in the peripheral region of the showerhead 110 (e.g., radially outward of the substrate region 410) may not be arranged in an alternating pattern. However, the showerhead 110 is advantageously sized larger than the substrate being processed so that any non-alternating gas distribution holes of the plurality of first gas distribution holes 306 and the plurality of second gas distribution holes 308 are disposed in the peripheral region, radially outward of the substrate region 410, thus minimizing any deposition non-uniformity due to the gas distribution hole pattern. In some embodiments, the first exhaust port 152 is disposed above an outermost hole 404 of the plurality of first gas distribution holes 306. In some embodiments, the second exhaust port 154 is disposed above an outermost hole 408 of the plurality of second gas distribution holes 308.

Figure 5:
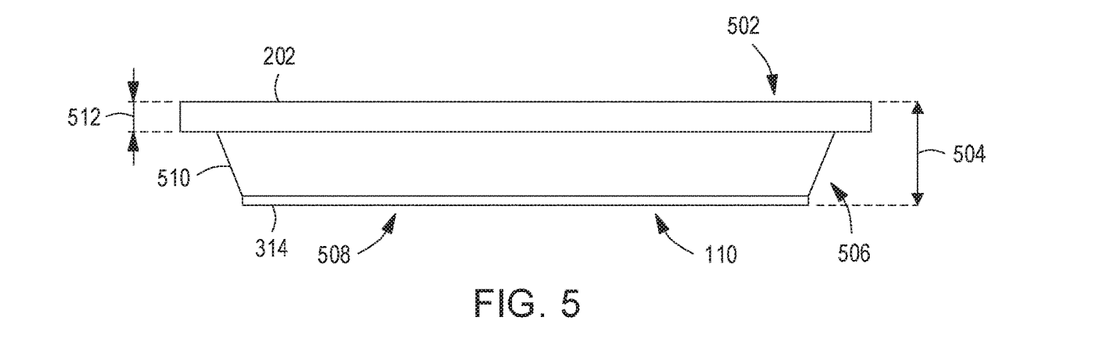
FIG. 5 depicts a side view of a showerhead in accordance with some embodiments of the present disclosure.

FIG. 5 depicts a side view of a showerhead in accordance with some embodiments of the present disclosure. In some embodiments, the showerhead includes an upper portion 502 and a lower portion 506. In some embodiments, the upper portion 502 extends radially outward of the lower portion 506. In some embodiments, an outer surface 510 of the lower portion 506 extends radially inward from the upper portion 502 to the lower surface 314. In some embodiments, the lower surface 314 includes a surface coating 508 to provide better corrosion resistance to precursors used in many substrate processing applications (such as ALD). In some embodiments, the surface coating 508 can provide better emissivity control to provide process stability from the beginning of the component life, for example, in a thermal ALD process. In some embodiments, the surface coating 508 comprises a conductive material such as an antimony-doped tin oxide (ATO).

The outer diameter of the lower surface 314 is greater than an outer diameter of the substrate 112 being processed. In some embodiments, the outer diameter of the lower surface 314 is about 13.0 inches to about 16.0 inches. In some embodiments, a height 504 of the showerhead from the upper surface 202 to the lower surface 314 is about 2.0 inches to about 3.0 inches. In some embodiments, a height 512 of the upper portion 502 is about 0.4 inches to about 1.0 inches.

While the foregoing is directed to embodiments of the present disclosure, other and further embodiments of the disclosure may be devised without departing from the basic scope thereof.

The invention claimed is:

1. A showerhead for use in a process chamber, comprising:
    a first spiral channel extending from a central region of the showerhead to a peripheral region of the showerhead;
    a second spiral channel extending from the central region of the showerhead to the peripheral region of the showerhead, wherein the second spiral channel is interleaved with the first spiral channel and fluidly independent from the first spiral channel;
    a plurality of first channels extending from the first spiral channel to a plurality of first gas distribution holes on a lower surface of the showerhead, wherein each first channel is a singular channel extending at a first angle greater than zero with respect to an axis normal to the lower surface of the showerhead, and wherein the first channels are radially offset along the first spiral channel; and
    a plurality of second channels extending from the second spiral channel to a plurality of second gas distribution holes on the lower surface of the showerhead, wherein each second channel is a singular channel extending at a second angle greater than zero with respect to the axis normal to the lower surface of the showerhead, and wherein the second channels are radially offset along the second spiral channel.

2. The showerhead of claim 1, wherein the plurality of first gas distribution holes and the plurality of second gas distribution holes converge in an alternating fashion along a common spiral pattern at the lower surface of the showerhead.

3. The showerhead of claim 1, wherein the first angle and the second angle are about 2 degrees to about 9 degrees.

4. The showerhead of claim 1, wherein each of the plurality of first channels and the plurality of second channels include an upper portion and a lower portion, wherein the lower portion has a diameter greater than a diameter of the upper portion to choke a flow therethrough.

5. The showerhead of claim 1, wherein an upper surface of the showerhead includes a plurality of openings configured to receive mounting screws.

6. The showerhead of claim 1, wherein an outer surface of the showerhead includes a groove configured to align the showerhead with a lid assembly.

7. The showerhead of claim 1, wherein an upper surface includes a purge gas inlet configured to flow a purge gas through the showerhead.

8. The showerhead of claim 1, wherein an upper surface of the showerhead includes a recess that defines a first surface having a sealing groove.

9. The showerhead of claim 1, wherein the first spiral channel includes only a single first channel at any given cross-section along the first spiral channel taken normal to inner sidewalls of the first spiral channel, and the second spiral channel includes only a single second channel at any given cross-section along the second spiral channel taken normal to inner sidewalls of the second spiral channel.

10. A showerhead for use in a process chamber, comprising:
    a lower surface of the showerhead having a plurality of first gas distribution holes and a plurality of second gas distribution holes;
    an upper surface of the showerhead having a recess that defines a first surface;
    a first spiral channel extending from a central region of the first surface to a peripheral region of the first surface in a spiral pattern;
    a plurality of first channels extending from the first spiral channel to the plurality of first gas distribution holes in a staggered manner and radially offset along the first spiral channel;
    a second spiral channel extending from the central region of the first surface to the peripheral region of the first surface in a spiral pattern, wherein the second spiral channel is fluidly independent of the first spiral channel; and a plurality of second channels extending from the second spiral channel to the plurality of second gas distribution holes in a staggered manner and radially offset along the second spiral channel wherein the plurality of first channels and the plurality of second channels extend at an angle of about 2 degrees to about 9 degrees with respect to an axis normal to the lower surface of the showerhead.

11. The showerhead of claim 10, wherein the first spiral channel and the second spiral channel have a width of about 0.1 inches to about 0.4 inches.

12. The showerhead of claim 10, wherein the first spiral channel and the second spiral channel have a depth of about 0.1 inches to about 1.20 inches.

13. The showerhead of claim 10, wherein an outer diameter of the lower surface is about 13.0 inches to about 16.0 inches.

14. The showerhead of claim 10, wherein an outer surface of the showerhead extends radially inward from the upper surface to the lower surface.

15. A process chamber, comprising:
a chamber body having a processing volume;
a substrate support disposed in the processing volume and having a substrate support surface to support a substrate having an outer edge;
a showerhead disposed in the processing volume opposite of the substrate support, wherein the showerhead comprises:
a first spiral channel and a second spiral channel extending from a central region of the showerhead to a peripheral region of the showerhead, wherein the first spiral channel is interleaved with and fluidly independent from the second spiral channel;
a plurality of first channels extending from the first spiral channel to a plurality of first gas distribution holes on a lower surface of the showerhead;
a plurality of second channels extending from the second spiral channel to a plurality of second gas distribution holes on the lower surface of the showerhead, wherein the plurality of first gas distribution holes and the plurality of second gas distribution holes extend at an angle with respect to an axis normal to the lower surface of the showerhead; and
a first exhaust port coupled to the first spiral channel and a second exhaust port coupled to the second spiral channel, wherein the first exhaust port and the second exhaust port are disposed about 0.25 inches to about 1.50 inches radially outward of an outer edge of the substrate support surface.

16. The process chamber of claim 15, wherein the plurality of first channels and the plurality of second channels extend at an angle of about 2 degrees to about 9 degrees.

17. The process chamber of claim 15, wherein a first inlet is coupled to the first spiral channel to provide a first process gas to the processing volume, and a second inlet is fluidly coupled to the second spiral channel to provide a second process gas to the processing volume.

18. The process chamber of claim 17, wherein each of the plurality of first channels and the plurality of second channels include an upper portion and a lower portion, wherein the lower portion has a diameter greater than a diameter of the upper portion to choke a flow therethrough.

19. The process chamber of claim 15, further comprising an isolator disposed between the showerhead and the chamber body.

20. The process chamber of claim 19, wherein the isolator includes an annular channel at an upper surface of the isolator configured to flow a purge gas therethrough.

* * * * *